(12) United States Patent
Isoda et al.

(10) Patent No.: US 7,352,611 B2
(45) Date of Patent: Apr. 1, 2008

(54) SEMICONDUCTOR INTEGRATED CIRCUIT

(75) Inventors: Masanori Isoda, Sayama (JP); Masanao Yamaoka, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/655,057

(22) Filed: Jan. 19, 2007

(65) Prior Publication Data
US 2007/0115748 A1 May 24, 2007

Related U.S. Application Data

(63) Continuation of application No. 11/048,932, filed on Feb. 3, 2005, now Pat. No. 7,196,960.

(30) Foreign Application Priority Data

Feb. 19, 2004 (JP) ............................ 2004-042217

(51) Int. Cl.
*G11C 11/00* (2006.01)
(52) U.S. Cl. ........................ 365/154; 365/226; 365/227
(58) Field of Classification Search ................ 365/154, 365/226, 227
See application file for complete search history.

(56) References Cited

U.S. PATENT DOCUMENTS

| | | | |
|---|---|---|---|
| 5,452,246 A * | 9/1995 | Kawashima | ................. 365/154 |
| 5,563,839 A | 10/1996 | Herdt et al. | |
| 5,734,604 A | 3/1998 | Akamatsu et al. | |
| 6,603,345 B2 | 8/2003 | Takahashi | |
| 7,196,960 B2 * | 3/2007 | Isoda et al. | ................. 365/227 |

* cited by examiner

*Primary Examiner*—Huan Hoang
(74) *Attorney, Agent, or Firm*—Reed Smith LLP; Stanley P. Fisher, Esq.; Juan Carlos A. Marquez, Esq.

(57) ABSTRACT

Data breakdown due to fluctuation of an operation power source is suppressed by suppressing a sub-threshold leakage current. A semiconductor integrated circuit includes a pair of power source wires, a plurality of static memory cells, a voltage control circuit for controlling an operation voltage applied from the power source wires to the static memory cells, a monitor circuit for monitoring a voltage of the power source wires and a mode control circuit for controlling a plurality of operation modes. The monitor circuit can detect a change of decrease of a potential difference between the pair of power source wires. The voltage control circuit can execute control in such a manner as to reduce the potential difference of a pair of power source nodes of the static memory cell in response to indication of the low power consumption mode by the mode control circuit and can execute control in such a manner as to increase the potential difference of the pair of power source nodes of the static memory cell in response to detection of the decrease of the potential difference between the pair of power source wires by the monitor circuit.

7 Claims, 12 Drawing Sheets

SEMICONDUCTOR INTEGRATED CIRCUIT

CROSS REFERENCE TO RELATED APPLICATIONS

This application is a Continuation of nonprovisional U.S. application Ser. No. 11/048,932 filed Feb. 3, 2005 now U.S. Pat. No. 7,196,960. Priority is claimed based on U.S. application Ser. No. 11/048,932 filed Feb. 3, 2005, which claims the priority of Japanese application 2004-042217 filed on Feb. 19, 2004.

BACKGROUND OF THE INVENTION

1. Field of the Invention

This invention relates to a semiconductor integrated circuit having static memory cells. More particularly, the invention relates to a semiconductor integrated circuit that can suppress or mitigate the occurrence of a sub-threshold leakage current by reducing a potential difference of a pair of power source nodes of a static memory cell and to a technology that will be effective when it is applied to SRAM (static random access memory), for example.

2. Description of the Related Art

A patent document 1, listed below, describes a low potential supply circuit for shifting a power source potential or a ground potential of a memory array in a static operation mode. This low potential supply circuit has a parallel circuit of a switch and a diode. The switch is turned OFF in the static operation mode such as a standby mode and the ground potential of the memory array rises by a potential corresponding to a barrier potential component of the diode to thereby reduce a potential between a power source node and a ground node of the memory cell. Consequently, a useless consumed current in the static operation mode can be reduced without impeding a circuit operation in a dynamic operation mode.

A patent document 2, listed below, describes a technology that intermittently brings a ground power source line of a flip-flop constituting a memory cell into a floating state at the time of standby of the memory cell. Because the ground power source line is intermittently brought into the floating state, the potential of the ground node of the memory cell rises and an OFF leakage current (sub-threshold leakage current) of the memory cell can be decreased.

Patent Document 1: Japanese Laid-Open Patent Publication No. 2002-197867

Patent Document 2: Japanese Laid-Open Patent Publication No. Hei 9 (1997)-185887

The inventor of the invention has examined disadvantages that will occur when the potential difference between the power source node and the ground node of the memory cell is decreased so as to decrease the sub-threshold leakage current during standby. A data holding voltage of the memory cell drops when the potential difference is decreased. When the drop of the power source potential of the circuit or the rise of the ground potential of the circuit occurs under this state due to fluctuation of the power source voltage, the data holding voltage applied to the memory cell becomes further smaller. The drop of the data holding voltage enhances the influences of fluctuation of a substrate voltage and soft errors resulting from α rays and the data held by the memory cells is more likely to under go breakdown. The prior art technologies listed above do not take these problems into account.

SUMMARY OF THE INVENTION

It is an object of the invention to provide a semiconductor integrated circuit capable of suppressing data breakdown of a static memory cell due to fluctuation of an operation power source that becomes more remarkable with the decrease of a potential difference between a power source node and a ground node of a memory cell to suppress a sub-threshold leakage current.

The above and other objects and novel features of the invention will become more apparent from the following description of the specification when taken in conjunction with the accompanying drawings.

The following represents the outlines of typical inventions among the inventions disclosed herein.

A semiconductor integrated circuit includes a pair of power source wires (power source lines) (10, 11), a plurality of static memory cells (18), a voltage control circuit (20) for controlling an operation voltage applied from the power source wires to the static memory cells, a monitor circuit (21) for monitoring a voltage of the power source wires and a mode control circuit (5) for controlling a plurality of operation modes. The mode control circuit can control a low power consumption mode of the semiconductor integrated circuit. The monitor circuit can detect a change of decrease of a potential difference between the pair of power source wires. The voltage control circuit can execute control in such a manner as to reduce the potential difference of a pair of power source nodes (arvss, arvdd) of the static memory cell in response to indication of the low power consumption mode by the mode control circuit and can execute control in such a manner as to increase the potential difference of the pair of power source nodes of the static memory cell in response to detection of the decrease of the potential difference between the pair of power source wires by the monitor circuit.

A sub-threshold leakage current decreases when the potential difference between the pair of power source nodes of the static memory cell is controlled into a decreasing direction in the low power consumption mode. Because a data holding voltage of the static memory becomes small, on the other hand, influences of fluctuation of a substrate voltage and α rays become greater but the further decrease of the data holding voltage is prevented by controlling the potential difference of the pair of power source nodes of the static memory cells into an increasing direction in response to the detection of the decrease of the potential difference between the pair of power source wires.

According to a concrete embodiment of the invention, a substrate area of an MOS transistor constituting the static memory cell is connected to a corresponding power source wire, a threshold voltage of the MOS transistor is increased in response to the decrease of the potential difference of the pair of power source nodes of the static memory cell and the threshold voltage of the MOS transistor is decreased when the potential difference of the pair of power source nodes of the static memory cell is increased. The static memory cell can employ the construction in which a high resistance load is connected to a differential input MOS transistor or a complementary MOS latch construction in which one of the inputs of a pair of complementary MOS inverters is mutually connected to the other output.

At this time, the voltage control circuit may employ a variable impedance circuit arranged in a path for applying a ground potential to the static memory cell or a variable impedance circuit arranged in a path for applying the power source potential to the static memory cells. The former variable impedance circuit is brought into a high impedance state as viewed from the static memory cell and controls an n channel MOS transistor in an increasing direction of a threshold voltage thereof and is brought into a low impedance state as viewed from the static memory cell and controls the n channel MOS transistor in a decreasing direction of a threshold voltage thereof. This construction is suitable when the threshold voltage of p channel MOS transistor (MP1, MP2) is set to a high value in the static memory cell having the complementary MOS latch structure or when the high resistance load type static memory cell is employed, for example. The latter variable impedance circuit is brought into a high impedance state as viewed from the static memory cell and controls a p channel MOS transistor in an increasing direction of a threshold voltage thereof and is brought into a low impedance state as viewed from the static memory cell and controls the p channel MOS transistor in a decreasing direction of a threshold voltage thereof. This construction is suitable when the threshold voltage of the p channel MOS transistor (MP1, MP2) is set to a low value in the static memory cell having the complementary MOS latch structure, for example.

When a ground noise level is exclusively expected to increase in another concrete embodiment of the invention, the monitor circuit described above may be a circuit (21B) for detecting the change of the decrease of the potential difference between the pair of power source wires on the basis of the level change of one of the power source wires supplying the ground potential. When the power source noise is exclusively expected to increase, on the contrary, the monitor circuit may be a circuit (21A) for detecting the change of the decrease of the potential difference between the pair of power source wires on the basis of the level change of the other power source wire supplying the power source potential.

According to still another concrete embodiment of the invention, a semiconductor integrated circuit includes a static RAM and a central processing unit and wherein the static RAM includes the static memory cell, the voltage control circuit and the monitor circuit described above. In this case, the mode control circuit can indicate a low power consumption mode to the static RAM and keeps module standby while keeping the active state of the central processing unit. When the static RAM is a cache memory connected to the central processing unit, the mode circuit can indicate the low power consumption mode to the cache memory, too, when it indicates the low power consumption mode to the central processing unit.

The effects brought forth by the typical invention disclosed in this application are briefly as follows.

Data breakdown of the static memory cell due to fluctuation of the operation power source that becomes remarkable with the decrease of the potential difference between the power source node and the ground node of the memory cell for the purpose of supplying the sub-threshold leakage current can be suppressed.

DESCRIPTION OF THE PREFERRED EMBODIMENTS

Figure 1:
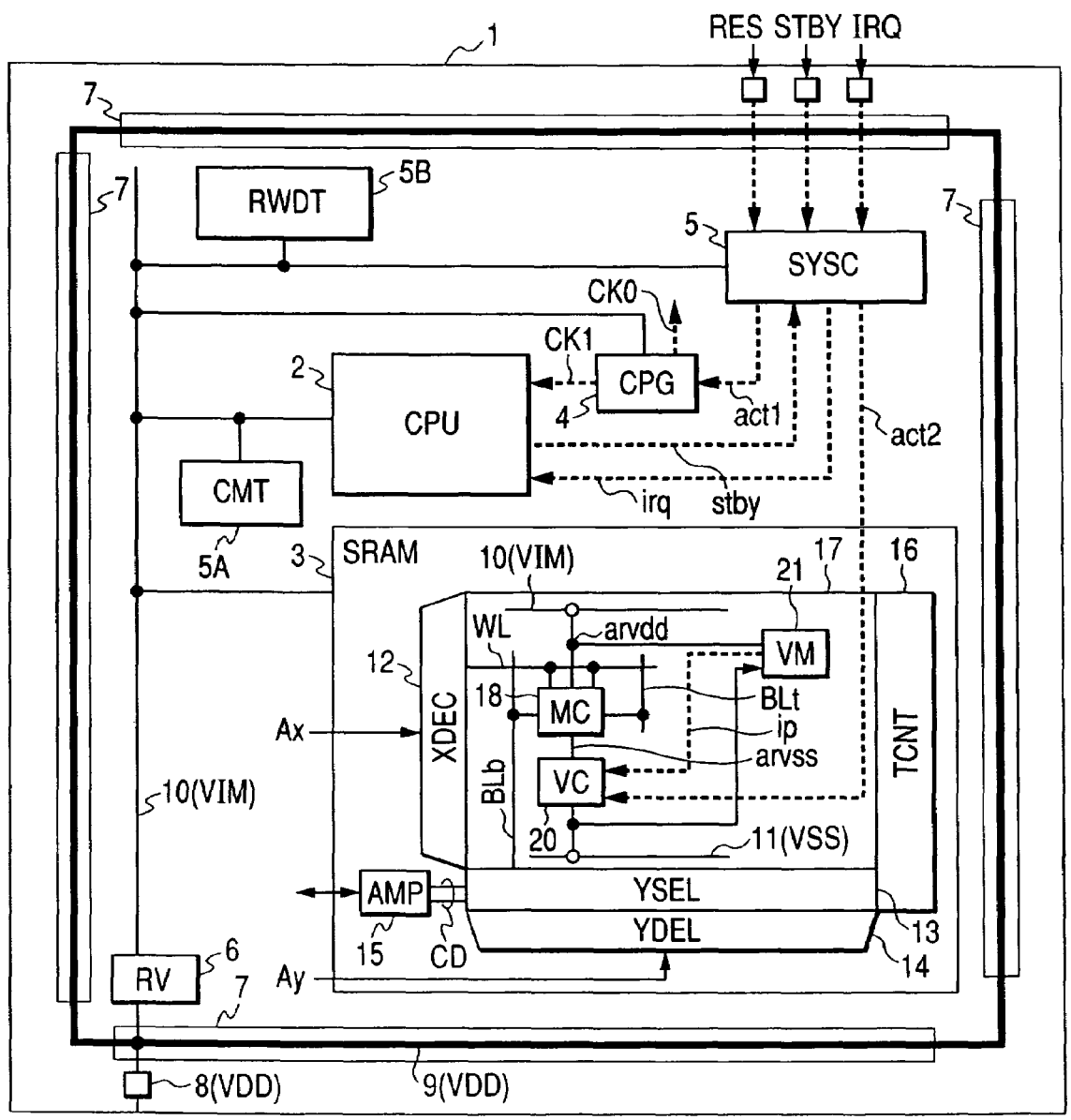
FIG. 1 is a block diagram of a microcomputer according an embodiment of the invention.

FIG. 1 typically shows an example of a microcomputer according to an embodiment of the invention. The microcomputer 1 is fabricated on a single semiconductor substrate by a known CMOS integrated circuit fabrication technology though the technology is not particularly limited. The microcomputer 1 includes a central processing unit (CPU) 2 shown typically, SRAM (Static RAM) 3, a clock pulse generator (CPG) 4, a system controller (SYSC) 5 as a mode control circuit, a regulator (voltage regulator, RV) 6, an external interface buffer (input/output buffer, I/O) 7, a compare/match timer (CMT) 5A and a watch dog timer (RWDT) 5B. These CPU 2, CPG4, SYSC 5, CMT 5A, RWDT 5B and SRAM 3 that are typically shown are connected by an internal bus for transmitting data signals, address signals and control signals, though the internal bus is omitted from the drawing.

The CPU 2 includes an instruction control portion for controlling instruction fetch and decoding the instruction fetched to generate a control signal and an execution portion for executing the instruction by executing an operation and operand fetch in accordance with the control signal. The SRAM 3 has a static memory cell array and is utilized as a work area of the CPU 2. In another form, the SRAM 3 is used as a cache memory. The CPG 4 generates an operation clock signal CK0 for the SYSC 5, the CMT 5A and the RWDT 5B and an operation clock signal CK1 for the CPU 2. The compare/match timer (CMT) 5A is used for controlling the generation timing of the internal interrupt, etc. The watch dog timer (RWDT) 5B is used for detecting runaway of the system through abnormality of the count value. The RV 6 receives the power source voltage (external power source voltage) VDD from the power source pad 8 typically shown and generates an internal power source voltage (internal power source voltage) VIM. The external power source voltage VDD is supplied to the I/O 7, etc, through the power source trunk 9. The internal power source voltage VIM is supplied to various internal circuits such as the CPU 2 and the SRAM 3 through the internal power source line 10. Incidentally, a large number of internal power source wires 10 are practically arranged in matrix.

The SYSC 5 controls reset, standby and interrupt of the microcomputer 1. When a reset signal RES is set to a low level, registers inside the microcomputer 1 are initialized and the SYSC 5 causes the CPU 2 to execute a reset exception processing in response to the change of the reset signal RES to a high level.

When a chip standby mode as one of the low power consumption modes is indicated, the SYSC 5 causes the CPG 4 to stop oscillation of the clock signal CK1 by the control signal act1 and to control the SRAM 3 to the standby state by the control signal act2. The indication of the chip standby mode is made when the standby signal STBY given from outside is activated or when the CPU 2 executes the sleep instruction to activate the internal standby signal stby. The supply of the clock signal CK0 to the SYSC 5, the CMT 5A and the RWDT 5B is not stopped in the chip standby mode and the interrupt acceptance control and the timer operation can be consecutively made. When an SRAM standby mode as a module standby mode that is another low power consumption mode is indicated, the SYSC 5 controls the SRAM 3 to the standby state by the control signal act 2. The SRAM standby mode is indicated when the CPU 2 sets an SRAM standby instruction bit of a control register (not shown) arranged in the SYSC 5.

When the interrupt request signal IRQ is inputted to the interrupt terminal, the SYSC 5 gives the interrupt signal irq to the CPU 2 and causes the CPU 2 to execute the interrupt processing for returning from state from the chip standby state to the active state. Consequently, the CPG 4 re-starts oscillation of the clock signal CK and the standby state of the SRAM 3 is released. The standby state of the SRAM can be independently released when the SRAM standby instruction bit of the control register (not shown) is reset by an instruction execution operation of CPU2.

The SRAM 3 includes a memory array (ARY) 17, an X address decoder (XDEC) 12, a Y selector (YSEL) 13, a Y address decoder (YDEC) 14, an amplifier (AMP) 15 and a timing controller (TCNT 16. The memory array 17 has a plurality of static memory cells (MC) 18 that are arranged in matrix. A selection terminal of each static memory cell 18 is connected to the word line WL and a data input/output terminal of the memory cell 18 is connected to complementary bit lines BLt and BLb. The X address decoder 12 decodes an X address Ax and connects the word line WL. The complementary bit line BL is selectively connected to a common data line CD through the Y selector 13. The Y address decoder 14 decodes the Y address Ay, generates a selection signal of the Y selector 13 and connects the selected complementary bit lines BLt and BLb to the common data line CD. The amplifier 15 senses and amplifies memory information read out to the common data line CD, outputs it to the outside of the SRAM such as a data bus, inputs write data supplied through the data bus and drives the common data line CD. The timing controller 16 generates an internal timing signal for a read/write operation.

The SRAM 3 includes a voltage control circuit (VC) 20 for controlling the operation voltage applied to the power source node of the static memory cell 18 from the power source wires 10 and 11 to materialize the standby state and a monitor circuit (VM) 21 for monitoring the voltage of one or both of the power source wires 10 and 11. The monitor circuit 21 can detect the change of decrease of the potential difference between the pair of power source wires 10 and 11 due to influences of noise of the power source system and activates the detection signal ip for only the period in which the potential difference between the pair of power source wires 10 and 11 decreases, for example. The voltage control circuit 20 executes control, in the first place, to reduce the potential difference between the pair of power source nodes arvdd and arvss of the static memory cell 18 in response to the indication of the low power consumption mode by the signal act2 from the SYSC 5. For example, the voltage control circuit 20 increases the resistance value between the power source wire 11 (VSS) and the power source node arvss and raises the level of the power source node arvss on the ground side. The voltage control circuit 20 executes control, in the second place, to increase the potential difference between the pair of power source nodes arvss and arvdd of the static memory cell 18 in response to detection of the decrease of the potential difference between the pair of power source wires 10 and 11 by the detection signal ip from the monitor circuit 21. For example, the voltage control circuit 20 decreases the resistance value between the power source wire 11 (VSS) and the power source node arvss and sets the value to the value under the active state for at least the detection period of the decrease of the potential difference.

The first control described above decreases the potential difference between the pair of power source nodes arvss and arvdd of the static memory cell 18 in response to the standby state in such a fashion as to reduce the sub-threshold leakage current that is likely to occur in the MOS transistor of the static memory cell 18. The second control so operates as to suppress the decrease of the data holding voltage due to the power source noise, etc, when data holding performance drops as the potential difference between the pair of power source nodes arvss and arvdd of the static memory cell 18 becomes small in accordance with the standby state.

Figure 2:
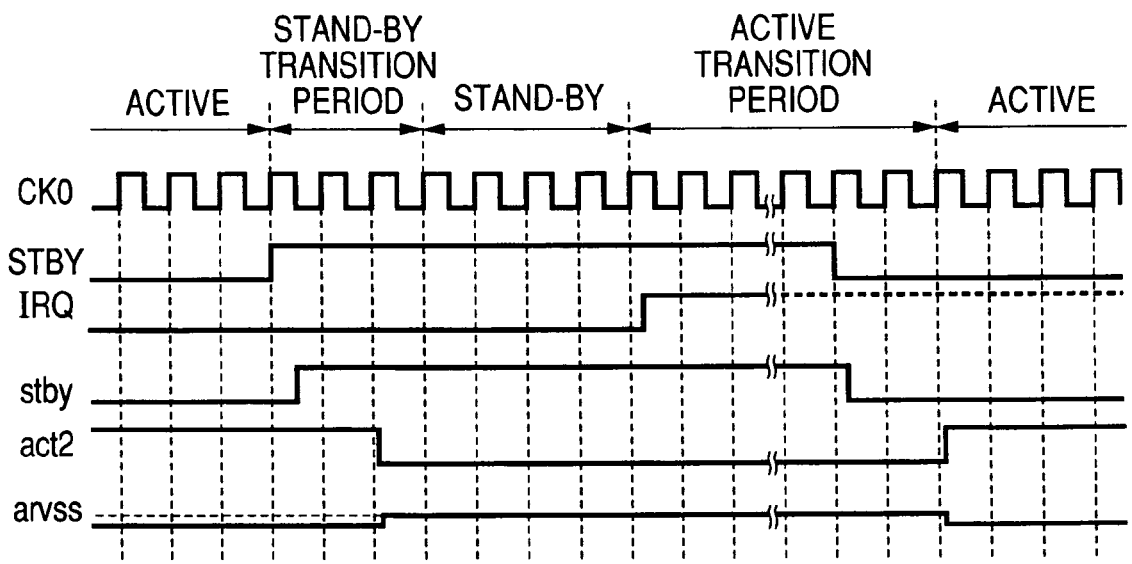
FIG. 2 is a timing chart typically showing a transition timing from an active state to a standby state and a condition of a power source node arvss under the active state and the standby state.

FIG. 2 typically shows the transition timing from the active state to the standby state and the state of the power source nodes arvss under the active state and under the standby state. FIG. 2 shows in the time series the active state (Active), the standby state (Standby) transition period, the standby state, the active transition period and the active state. The level of the power source node arvss on the ground potential side rise in the standby transition period and the standby state and the sub-threshold leakage current is reduced.

The SYSC 5, the CMT 5A and the RWDT 5B are made operative under the standby state as described above. Therefore, there is the possibility that the level rise in the ground potential side power source wire 11 (VSS) connected in common to the circuit blocks 5, 5A and 5B due to the operations of these circuit blocks and the voltage drop occurs in the power source wire 10 (VIM) on the internal power source voltage side. Even when the RV 6 is used, the voltage drop is likely to occur in the internal power source voltage VIM when design defect exists or dependence on the external power source VDD is great. Even when the external power source is as such used as the operation power source without using the RV 6, the voltage drop of the VDD is expected to occur due to insufficiency of power due to the discharge of the battery in the case of the battery power source.

Figure 3:
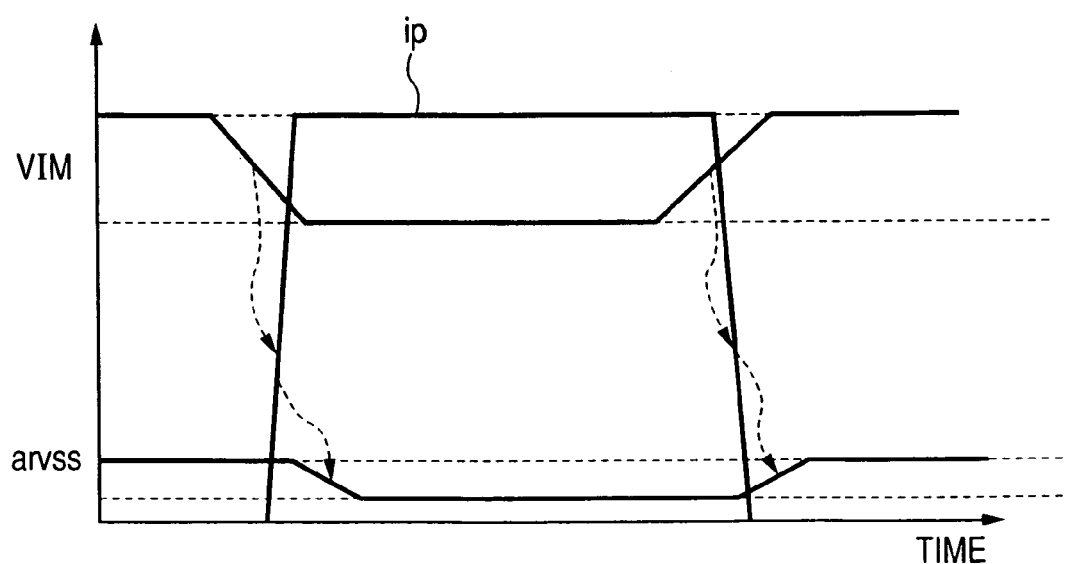
FIG. 3 is a timing chart showing a voltage control timing of a power source node on the ground potential side of a memory cell with respect to a level fluctuation of a power source wire on the side of a high potential.

FIG. 3 typically shows the voltage control timing of the power source node arvss with respect to the level fluctuation of such a power source wire 10. When the internal power source voltage VIM drops, the level of the power source node arvss of the static memory cell 18 on the ground potential side drops in response to the former and the drastic drop of the data holding voltage of the static memory cell 18 is suppressed.

Figure 4:
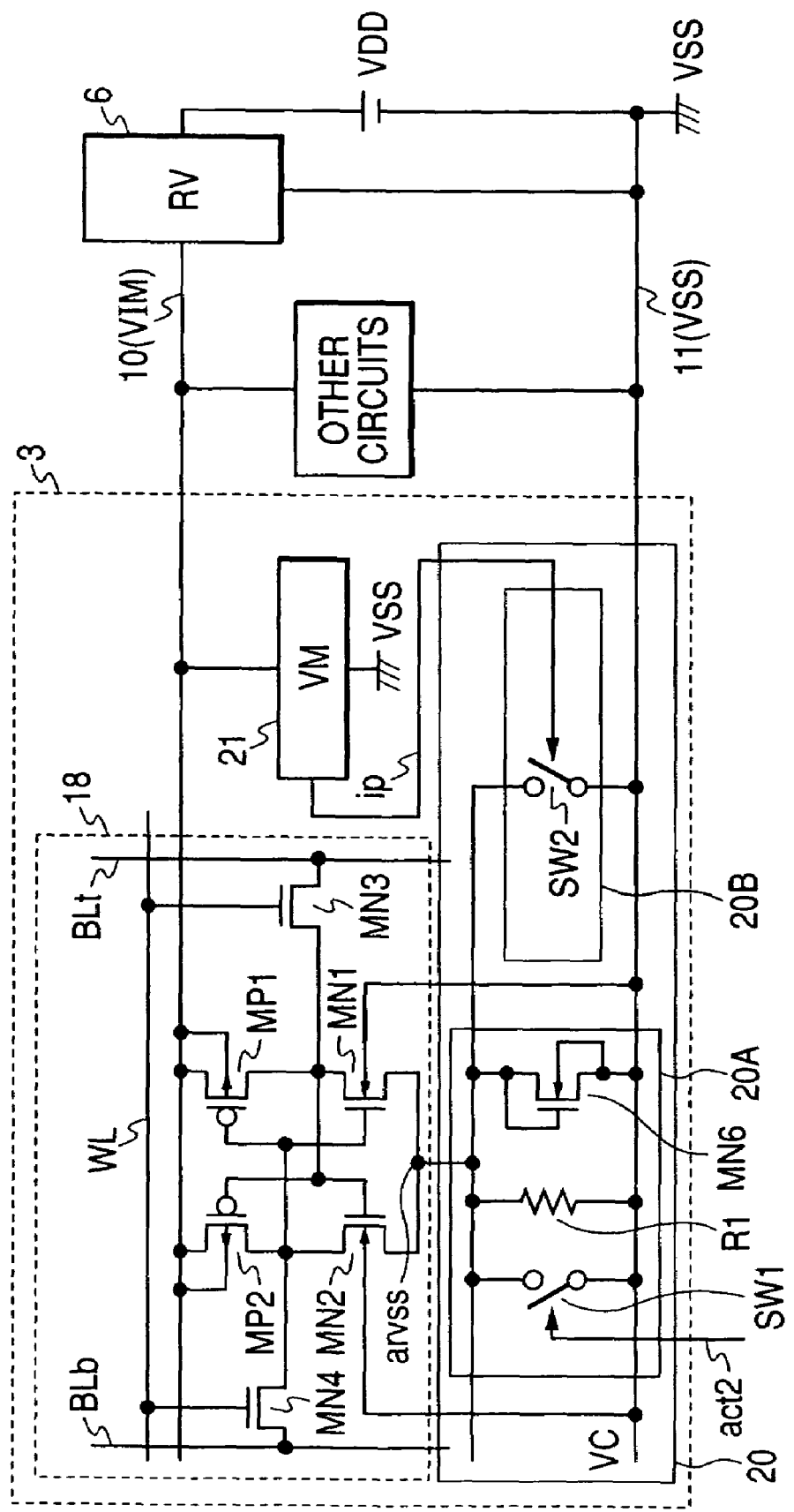
FIG. 4 is a block diagram showing an example of a voltage control circuit.

FIG. 4 shows an example of the voltage control circuit (VC) 20. The voltage control circuit 20 has variable impedance circuits 20A and 20B. One of the variable impedance circuits 20A is the circuit for exclusively reducing the sub-threshold leakage current and this circuit 20A is constituted by a switch SW1, a resistor R1 and a diode-connected MOS transistor MN6 that are connected in parallel with one another between the ground potential side power source wire 11 and the ground potential side power source node arvss of the memory cell. The MOS transistor MN6 compensates for variance of the resistor R1. The switch SW1 is controlled by the control signal act2 and is turned OFF under the standby state. When the switch SW1 is turned OFF, the level of the ground potential side power source node arvss is elevated by the potential division component corresponding to the threshold voltage of the MOS transistor MN6 and the resistance value of the resistor R1 with respect to the ground potential of the ground potential side power source wire 11. The switch SW1 is turned ON under the active state. The switch SW1 may be constituted by an n channel type MOS transistor, for example.

The other variable impedance circuit 20B includes a switch SW2 interposed between the ground potential side power source wire 11 and the ground potential side power source node arvss of the memory cell. The switch SW 2 may be constituted by an n channel type MOS transistor, for example. The switch SW2 is controlled by the control signal ip and is turned ON under the standby state as the power source wire 10 undergoes the voltage drop. Then, the level of the ground potential side power source node arvss drops, too, in response to the drop of the internal voltage VIM as explained with reference to FIG. 3. Consequently, the drastic decrease of the potential difference between the internal voltage VIM and the ground potential side power source node arvss of the memory cell is suppressed and breakdown of the data of the static memory cell is prevented.

FIG. 4 typically shows a circuit construction of a CMOS latch type as the static memory cell MC. In this construction, input terminals of a CMOS inverter including MOS transistors MP1 and MN1 and a CMOS inverter including MOS transistors MP2 and MN2 are mutually connected to their output terminals, one of the memory nodes is connected to the bit line BLb through a selection MOS transistor MN4, the other memory node is connected to the bit line BLt through a selection MOS transistor MN3 and the selection MOS transistors MN3 and MN4 are connected to the word line WL. A high resistance load type or other construction may be employed for the static memory cell 18, though not shown in the drawing. In the drawing, the term "other circuits" generically represents circuits such as the CPU 2 other than the SRAM3. Incidentally, VM21 and VC20 are disposed for a predetermined number of static memory cells 18 as will be explained later.

Figure 5:
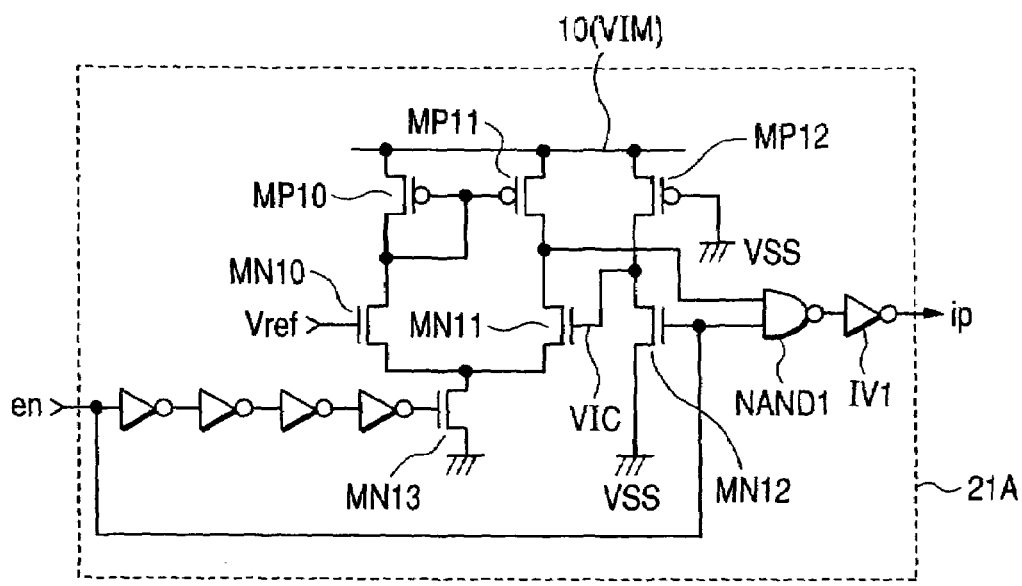
FIG. 5 is a circuit diagram showing a voltage drop detection circuit of an internal power source voltage as a concrete example of a monitor circuit.
Figure 6:
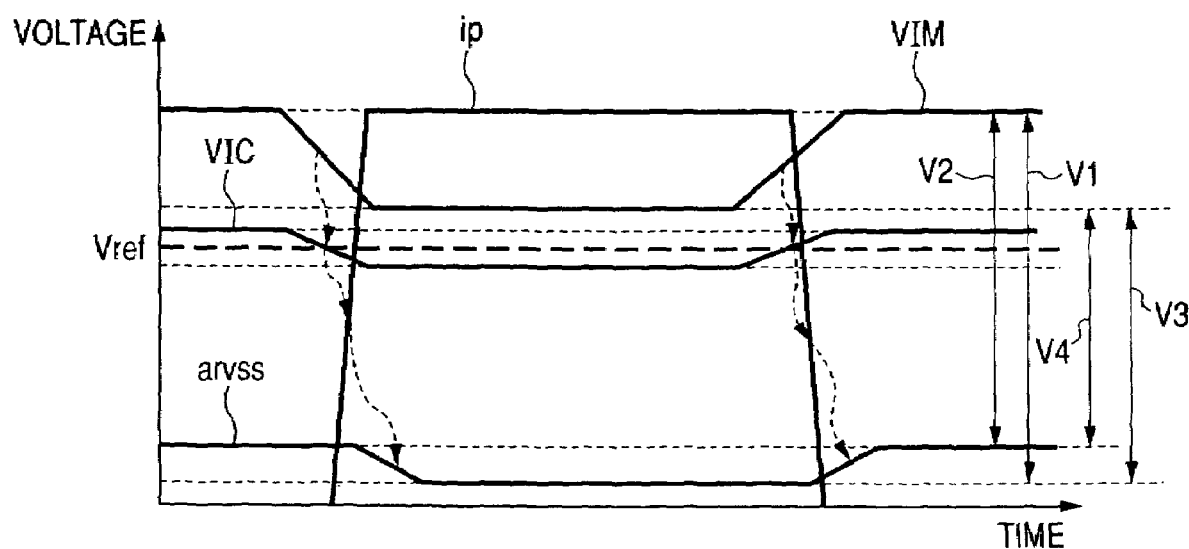
FIG. 6 is a timing chart showing operations of the monitor circuit and the voltage control circuit under the standby state.

FIG. 5 shows a concrete example of the monitor circuit 21. The monitor circuit 21 has a voltage drop detection circuit 21A of the internal power source voltage. The voltage drop detection circuit 21A of the internal power source voltage has a differential amplifier including MOS transistors MP10, MN10, MP11, MN11 and MN13 and amplifies a difference voltage of the input voltage VIC with respect to the reference voltage Vref. The voltage VIC is the voltage obtained by dividing the internal power source voltage VIM by a DC circuit including MOS transistors MP12 and MN 12 and has a level relationship shown in FIG. 6. The voltage VIC has a higher level than the reference voltage Vref when the internal power source voltage VIM has a normal level, and a lower level than the reference voltage Vref when the internal power source voltage VIM drops undesirably. The differential amplifier outputs a low level when the voltage VIC is higher than the reference voltage Vref and also outputs a low level signal ip through a series circuit of a NAND gate NAND1 and an inverter IV1. On the other hand, the differential amplifier outputs a high level when the voltage VIC is lower than the reference voltage Vref and inverts the signal ip to the high level. As the signal ip is set to the high level, the switch SW2 is turned ON and the level of the power source node arvss drops. A signal en is an activation control signal of the monitor circuit 21. The signal en may well be set to the control signal act2 described above, for example. Referring to FIG. 6, the potential difference of the pair of power source nodes of the static memory cell 18 is V1 under the active state, is V2 under the standby state, is V3 under the standby state and when impedance control is made by the variable impedance circuit 20B when the internal voltage drops and is V4 when such an impedance control is not made.

Figure 7:
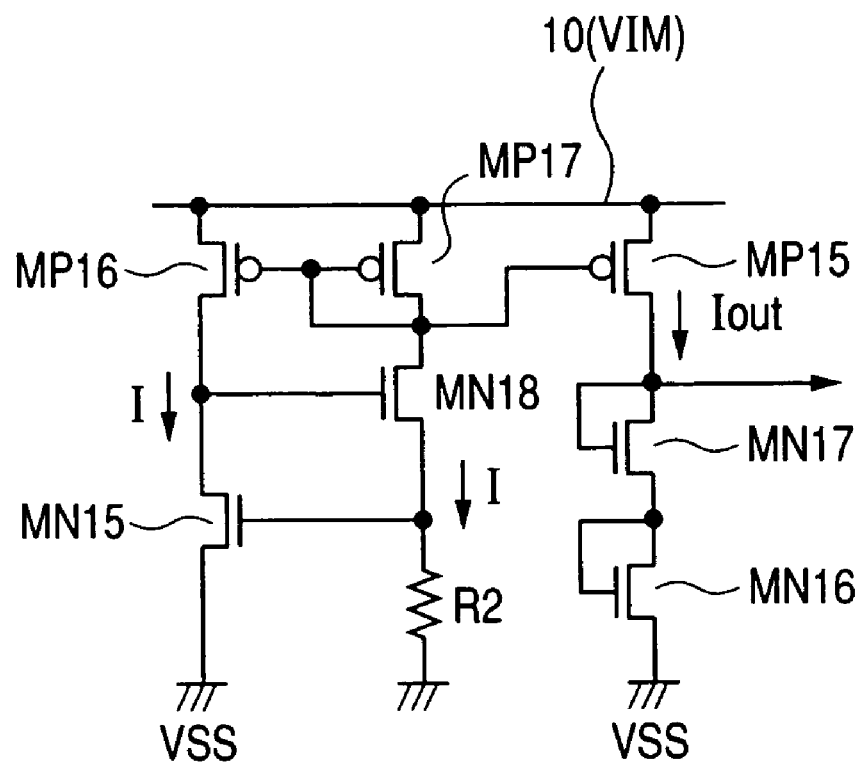
FIG. 7 is a circuit diagram showing an example of a reference voltage generation circuit that generates a reference voltage Vref.

FIG. 7 shows an example of a reference voltage generation circuit that generates the reference voltage Vref described above. The example shown in this drawing employs a self-bias type circuit for a bias circuit of a MOS transistor MP15 connected in series with MOS transistors MN16 and MN17. In this bias circuit, a source-drain current of the MOS transistor MP17 flows through the drain of the MOS transistor MP16 and the same current flows through the drain of the MOS transistor MN18. The relation I=Vt/R is satisfied when the drain current I of the MOS transistor MP16 is equal to the drain current I of the MOS transistor MN18. Symbol Vt represents a threshold voltage of the MOS transistor MN15 and symbol R represents a resistance value of the resistor R2. Therefore, the output current Iout is not affected by fluctuation of the power source VIM and the reference voltage Vref as a reference voltage can be acquired.

Figure 8:
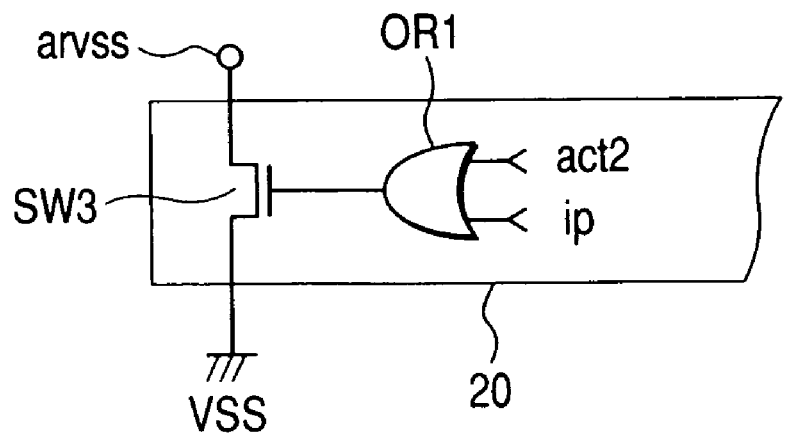
FIG. 8 is a circuit diagram showing a construction in which a switch for a variable impedance circuit for coping with a sub-threshold leak is used in common as a switch for a variable impedance circuit for coping with the drop of a memory holding voltage.

FIG. 8 shows a construction when the switches SW1 and SW2 are used in common. The switch SW1 of the variable impedance circuit 20A and the switch SW2 of the variable impedance circuit 20B are replaced by one switch SW3. The switch SW3 is materialized by an n channel type MOS transistor, for example. The switch control signal of SW3 is the output of a logical OR gate OR1 using the control signals ip and act2 as two inputs.

Figure 9:
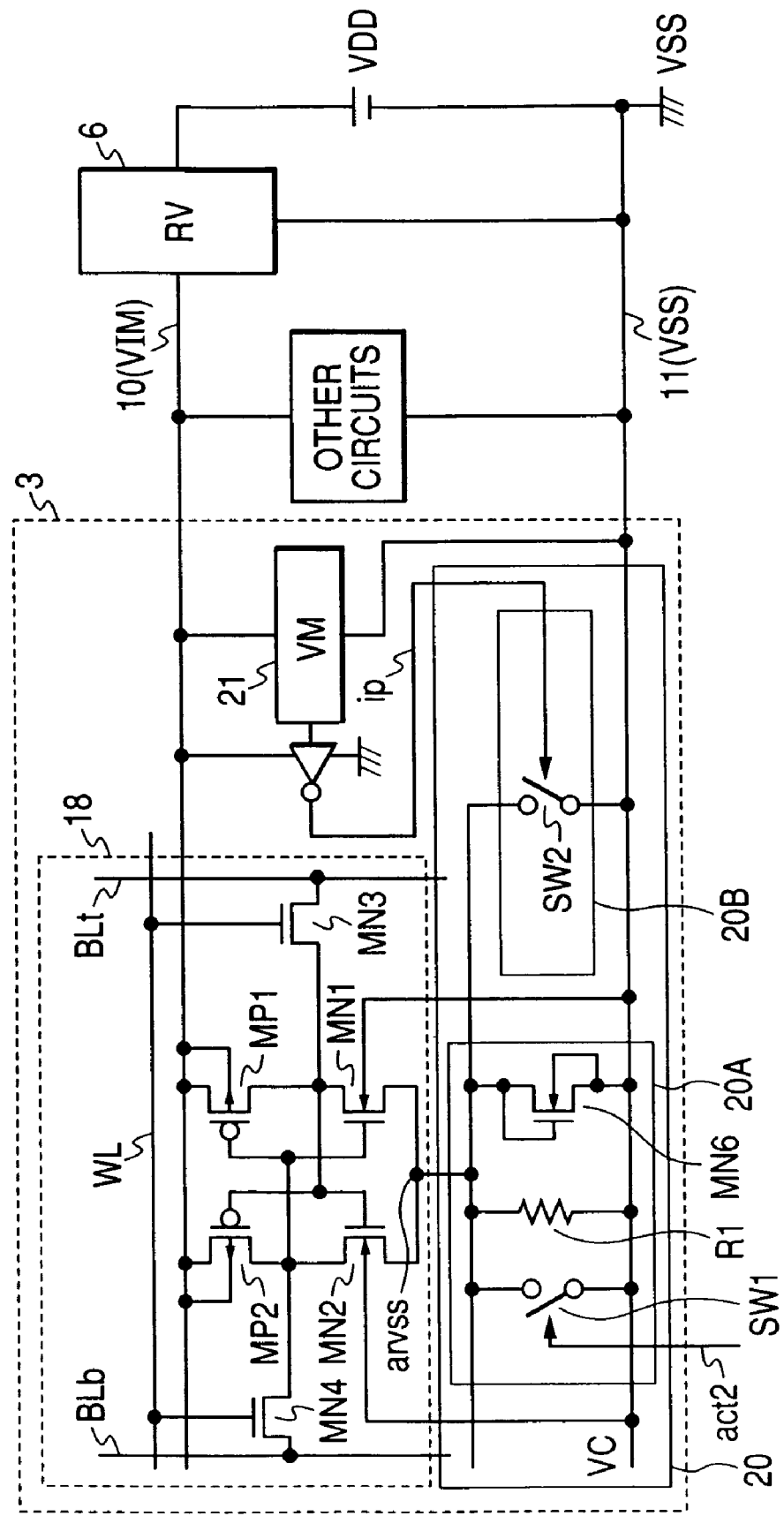
FIG. 9 is a block diagram typically showing an outline of SRAM in which a level rise on the ground side power source is detected by the monitor circuit.

FIG. 9 shows an SRAM for detecting the level rise of the ground side power source by the monitor circuit 21. The difference from FIG. 4 resides in that the monitor circuit 21 detects the level rise of the ground potential VSS. When the rise of the ground potential VSS is detected, the signal ip turns ON the switch SW2 and the level of the ground side power source node arvss of the static memory cell 18 is forcibly set to the ground potential VSS that has risen.

Figure 10:
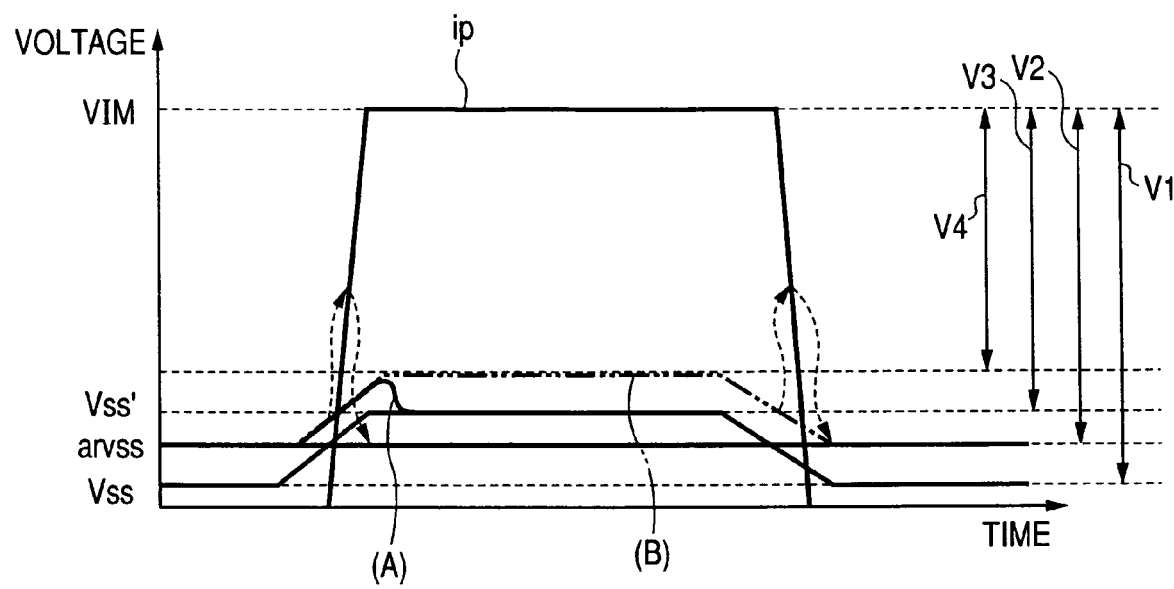
FIG. 10 is a timing chart typically showing an operation of the SRAM shown in FIG. 9.

FIG. 10 typically shows its operation waveform. It will be assumed that the ground potential VSS undesirably rises and reaches VSS' when the level of the ground side power source node arvss is set to be higher than the ground potential VSS under the standby state, for example. When this state is left standing as such, the level of the ground side power source node arvss similarly rises (waveform B). When the monitor circuit VM21 detects the rise at this time, the switch SW2 is turned ON and the ground side power source node arvss is set to be substantially equal to the ground potential VSS at that time (waveform A). When the ground potential VSS thereafter drops, the switch SW2 is closed in accordance with the voltage drop and the power source node arvss drops to the level corresponding to the voltage division voltage by the voltage control circuit 20 with respect to the ground potential VSS and is returned to the standby state under the normal state. Referring to FIG. 10, the potential difference of the pair of power source nodes arvss and arvdd of the static memory cell 18 is V1 under the active state, is V2 under the standby state, is V3 when an impedance control is made by 20B when the ground potential undesirably rises under the standby state and is V4 when such an impedance control is not made.

Figure 11:
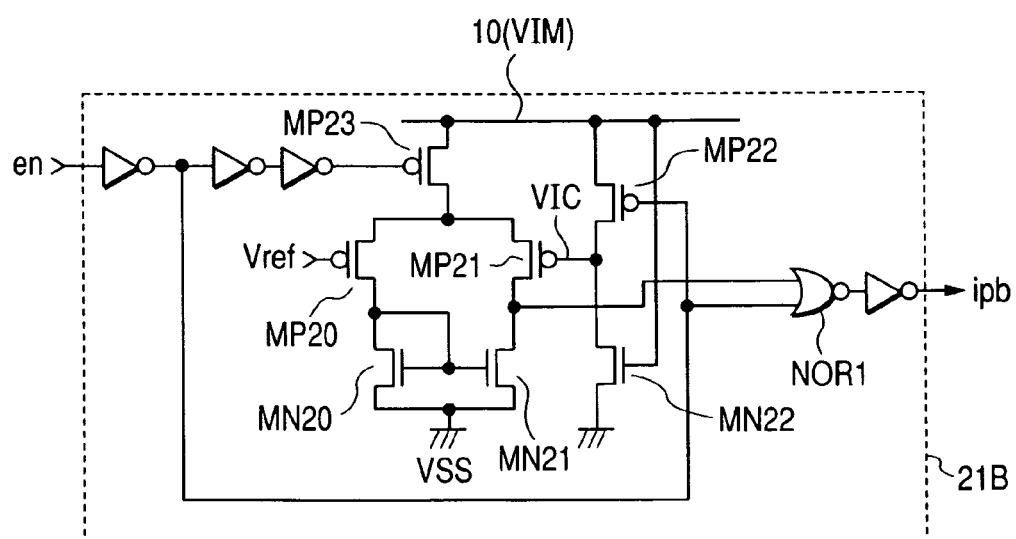
FIG. 11 is a circuit diagram showing a ground potential rise detection circuit as a concrete example of the monitor circuit of the SRAM shown in FIG. 9.

FIG. 11 shows a concrete example of the monitor circuit 21 shown in FIG. 9. The monitor circuit 21 has a rise detection circuit 21B of the ground potential. The rise detection circuit 21B of the ground potential has a differential amplifier including MOS transistors MP20, MN20, MP21, MN21 and MP23 and amplifies a difference voltage of the input voltage VIC with respect to the reference voltage Vref. The voltage VIC is the voltage obtained by dividing the internal power source voltage VIM by a series circuit of MOS transistors MP22 and MN22. The level of the voltage VIC is lower than that of the reference voltage Vref when the internal power source voltage VIM has the normal level and is higher than that of the reference voltage Vref when the internal power source voltage VIM undesirably drops. The differential amplifier outputs the high level when the voltage VIC is lower than the reference voltage Vref and also outputs the high level signal ipb through a series circuit of a NOR gate NOR1 and the inverter IV1. When the voltage VIC is higher than the reference voltage Vref, on the other hand, the differential amplifier outputs the low level and inverts the signal ipb to the low level. As the signal ipb is set to the low level, the switch SW2 receiving its inversion signal ip is turned ON and the level of the power source node arvss drops as indicated by the waveform (A) shown in FIG. 10. The signal en is the activation control signal of the monitor circuit 21. The signal en may well be set to the control signal act2 described above, for example.

Figure 12:
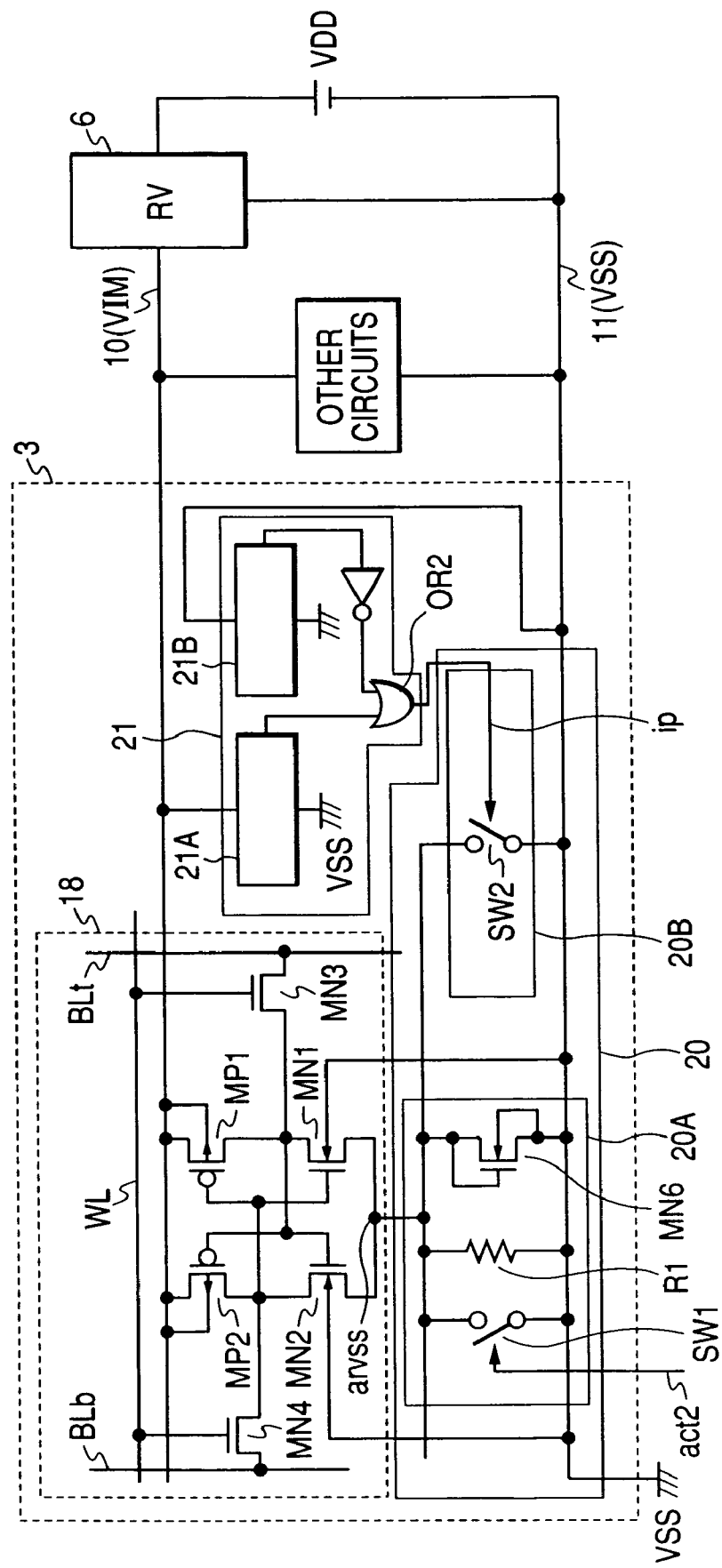
FIG. 12 is a block diagram typically showing SRAM in which fluctuation of both ground side power source and internal power source is detected by the monitor circuit.

FIG. 12 shows an SRAM for detecting fluctuation of both ground side power source and internal power source by the monitor circuit 21. In short, the monitor circuit 21 shown in FIG. 12 includes both of the voltage drop detection circuit 21A of the internal power source voltage explained with reference to FIG. 5 and the rise detection circuit 21B of the ground potential explained with reference to FIG. 11. The inversion signals of the output of the voltage drop detection circuit 21A and the output of the voltage rise detection circuit 21B are inputted to the OR gate OR2 and the OR output is supplied as the switch control signal ip to the switch SW2. Consequently, even when fluctuation occurs in the power source of either VSS or VIM under the standby state, the level of the power source node arvss can be changed to the direction in which the range of the data holding voltage of the static memory cell 18 is expanded, and reliability of preventing data breakage can be further improved.

Figure 13:
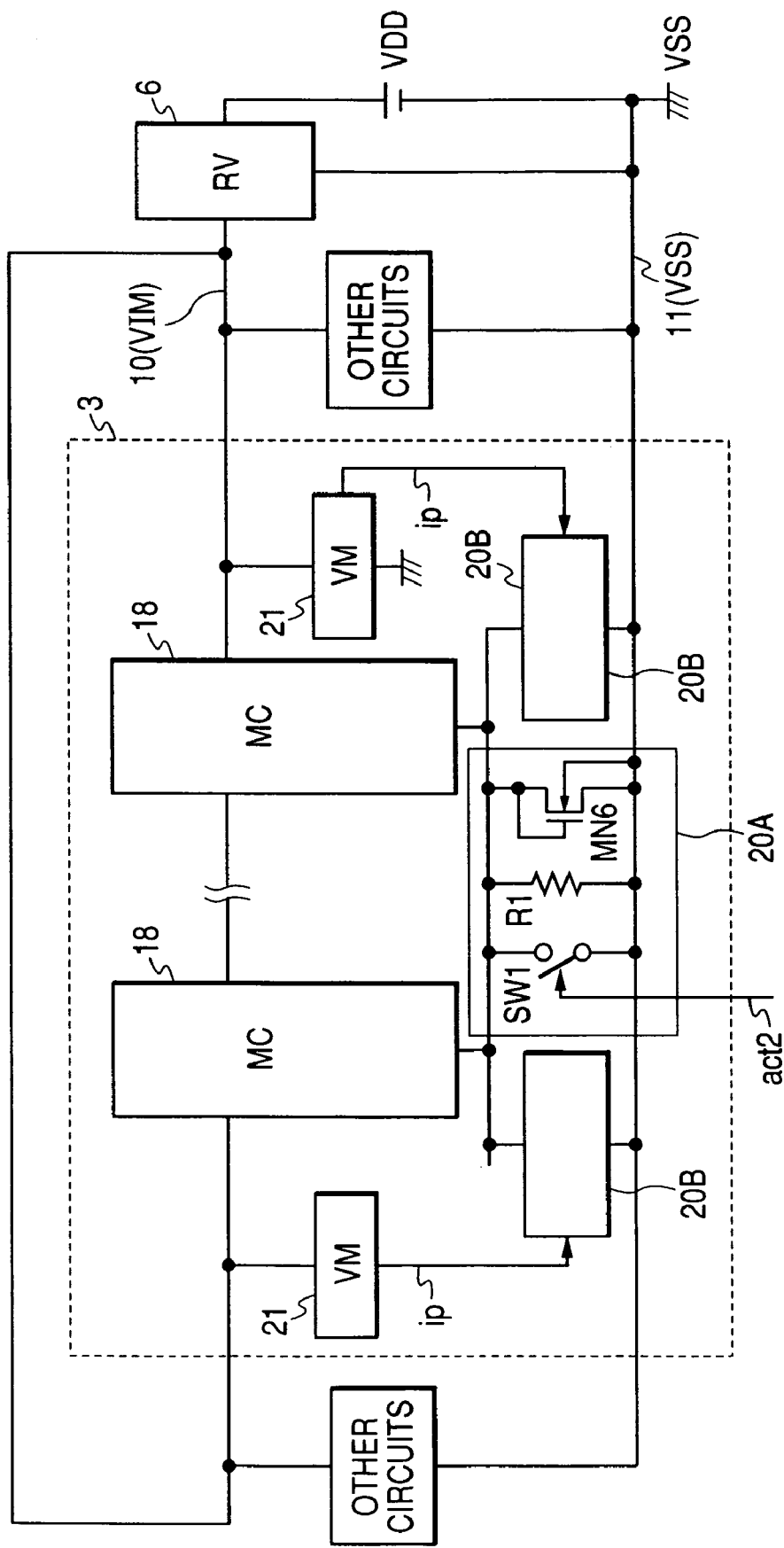
FIG. 13 is a block diagram showing an example of the arrangement of a monitor circuit and an impedance conversion circuit when the power source is supplied from both right and left of a memory array of the SRAM.

FIG. 13 shows an arrangement example of the monitor circuit and the impedance conversion circuit when the power sources are supplied from both right and left of the memory array as another example of the SRAM. Two static memory cells 18 typically shown represent the memory cells at both ends among a plurality of memory cells arranged in matrix. The operation power sources are supplied from both right and left sides through the power source wires 10. The VM21 and the impedance conversion circuits 20B are arranged on both right and left sides, respectively, lest the data holding voltage of the static memory cells 18 is reduced near the positions close to these static memory cells 18 in accordance with the monitor result. The variable impedance circuits 20A are not dispersed because dynamic control of the switch SW1 is not necessary.

Because the data holding voltage of the static memory is prevented from decreasing near the position at which power source fluctuation occurs even when a plurality of static memory cells is arranged, reliability of data retention can be further improved.

Figure 14:
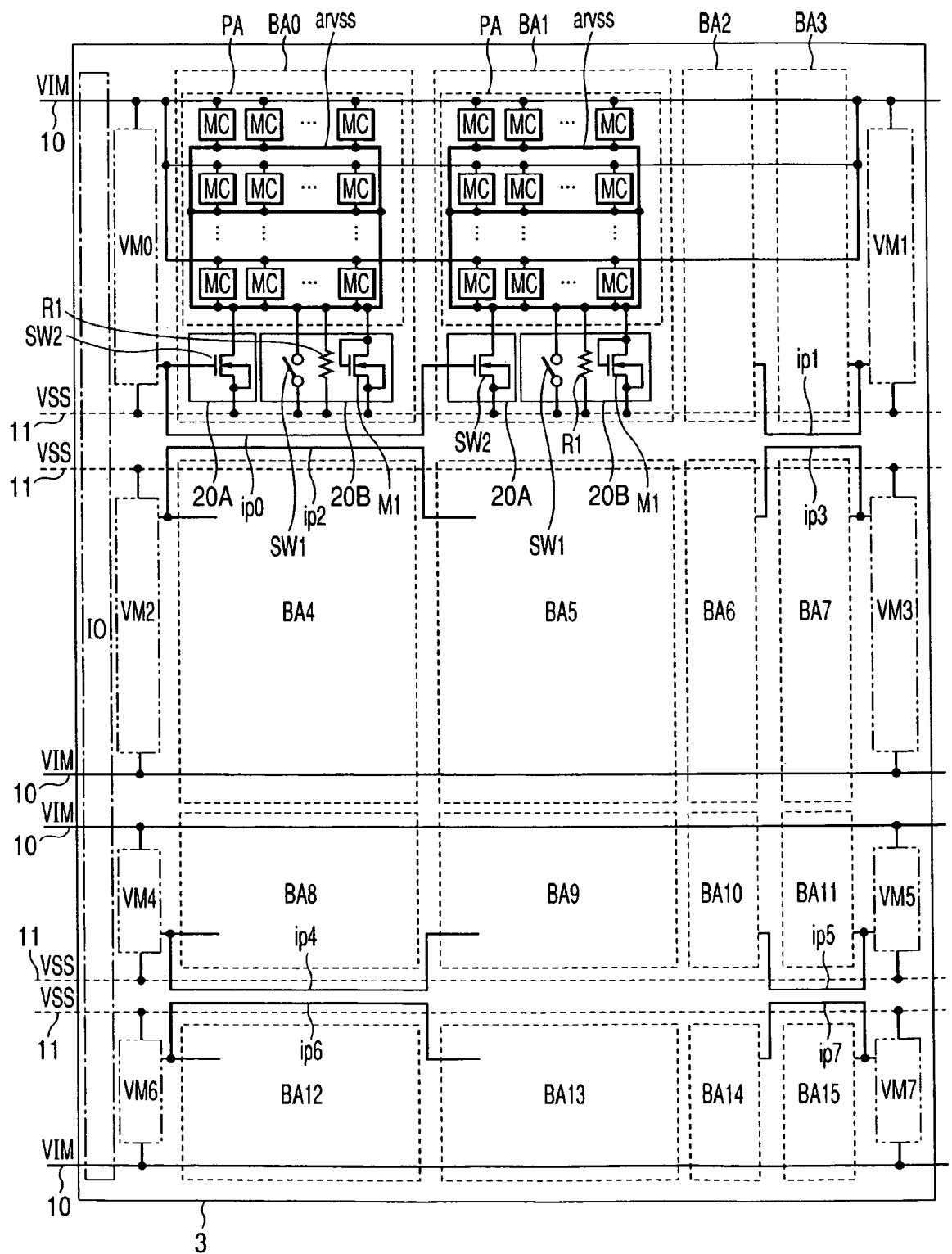
FIG. 14 is a block diagram showing an example the arrangement of the monitor circuit and the impedance conversion circuit in a single unit or in a plurality of units by dividing the memory array of the SRAM into a plurality of units.

FIG. 14 shows another example where the memory array is divided into a plurality of areas and the monitor circuits and the impedance conversion circuits are arranged in a single or plurality of units. The memory array is divided into a plurality of memory areas BA0 to BA15 and the variable impedance circuits 20A and 20B are arranged in each memory array. Eight monitor circuits VM0 to VM7 allocated to units of two memory areas are arranged on the right and left of the memory area. For example, the monitor circuit VM0 is allocated to the variable impedance circuits of the memory areas BA0 and BA1 and the monitor circuit VM7 is allocated to the variable impedance circuits of the memory areas BA14 and BA15. The switch control signals of the switch SW3 for these variable impedance circuits are ip0 to ip7.

When the voltage of the power source wire 10 (VIM) drops close to the monitor circuit VM0 under this construction, the signal ip0 changes to the high level, the variable impedance circuit 20B of the memory areas BA0 and BA1 are turned ON and the potential of the power source node arvss of the static memory cells (MC) 18 contained in the memory areas BA0 and BA1 are lowered. In consequence, the data holding voltage of the static memory cell 18 close to the memory area causing the power source fluctuation does not drastically drop due to the influences of the power source fluctuation and data breakdown can be minimized.

When the voltage of the power source wire 10 connected to the monitor circuit VM1 does not drop at this time without being affected by the voltage fluctuation described above (ends of the memory module having a large layout area are not easily affected by mutual voltage fluctuation due to the resistance of the power source wire), the switches SW2 are kept as such OFF in the memory areas BA2 and BA3, the reducing effect of sub-threshold leakage current by the variable impedance circuit 20A is maintained as such.

Because the monitor circuit 21 of the power source system voltage and the variable impedance circuits 20A and 20B are disposed for each divided area of the memory array as described above, breakage of the retention by the local power source fluctuation can be suppressed and the areas not affected by the influences can still keep the reducing effect of the sub-threshold leakage current. Consequently, improvement of reliability of data storage and low power consumption can be achieved.

Figure 15:
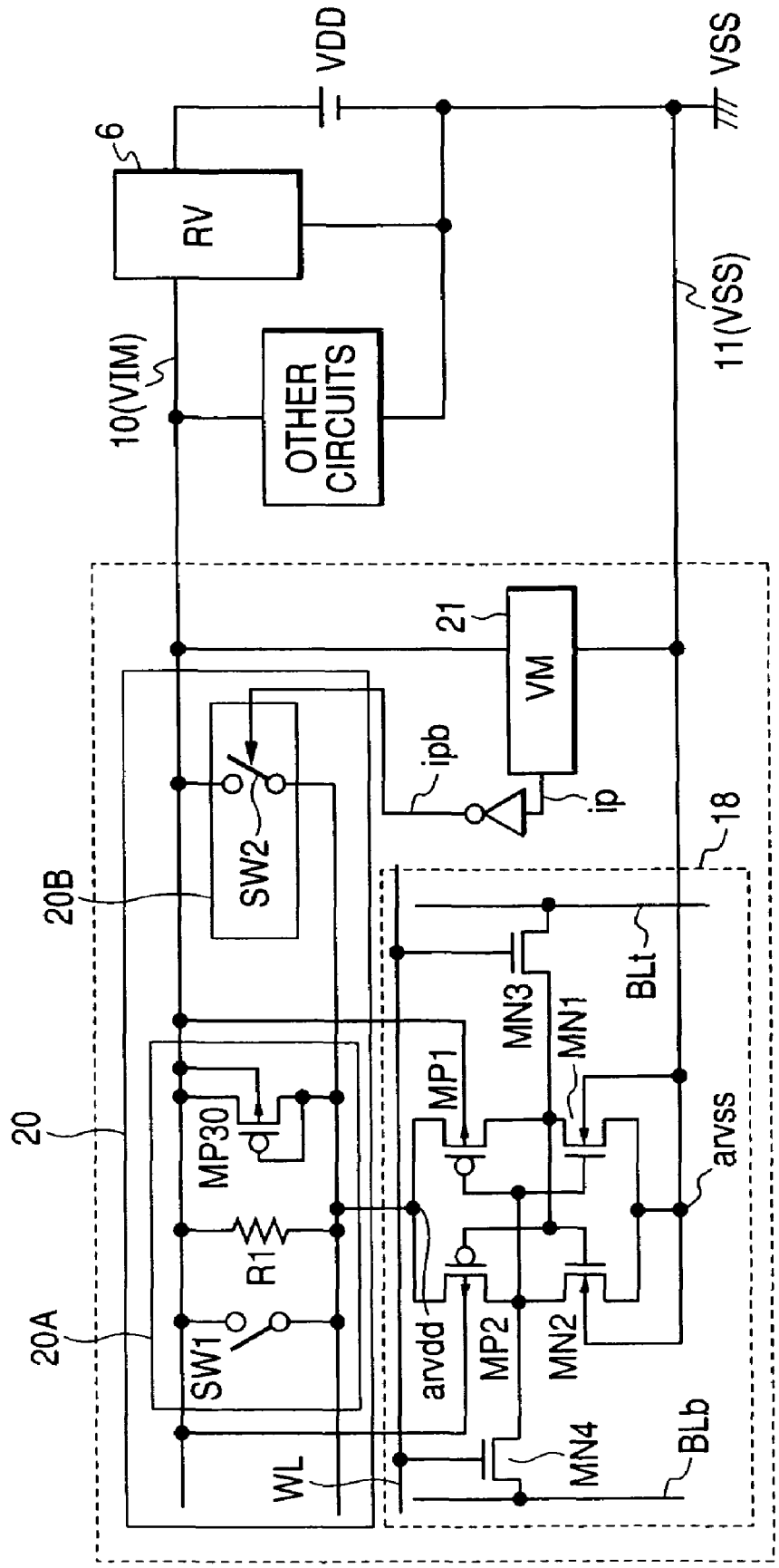
FIG. 15 is a block diagram showing an example of SRAM in which the variable impedance circuit is arranged on the power source node side of a static memory cell.

FIG. 15 shows an example where the variable impedance circuits are arranged on the power source node side of the static memory cell. In the construction explained with reference to FIG. 4, etc, the variable impedance circuits 20A and 20B are arranged in the path through which the ground potential VSS is applied to the static memory cell 18. The variable impedance circuits 20A and 20B are kept at a higher impedance than the static memory cell 18 so that the threshold voltages of the n channel MOS transistors MN1 and MN2 can be controlled to the increasing direction, and are kept at a lower impedance than the static memory cell 18 so that the threshold voltages of the n channel MOS transistors MN1 and MN2 can be controlled to the decreasing direction. This circuit construction is suitable when the threshold voltages of the p channel MOS transistors MP1 and MP2 are set to great values in the static memory cell 18 having the complementary MOS latch construction or when a high resistance load type static memory cell, not shown in the drawing, is employed. Almost all of ordinary static memory cells are taken into assumption. In short, this construction is effective when the leakage current of the p channel MOS transistors MP1 and MP2 is smaller than that of the n channel MOS transistors MN1 and MN2 in the static memory cell 18.

The example shown in FIG. 15 employs the variable impedance circuits 20A and 20B as the voltage control circuit 20 described above in the path through which the power source potential VIM is applied to the static memory cell 18. In this case, the variable impedance circuits 20A and 20B are set to the higher impedance state than the static memory cell 18 so that the threshold voltages of the p channel MOS transistors MP1 and MP2 can be controlled to the increasing direction, and are kept at a lower impedance than the static memory cell 18 so that the threshold voltages of the p channel MOS transistors MP1 and MP2 can be controlled to the decreasing direction. This construction is suitable when the threshold voltages of the p channel MOS transistors MP1 and MP2 are set to small values in the static memory cell 18 having the complementary MOS latch construction, for example. In FIG. 15, for example, the switch SW1 of the variable impedance circuit 20A and the switch SW2 of the variable impedance circuit 20B are constituted by p channel MOS transistors. An MOS diode MP30, too, is constituted by using the p channel MOS transistor. The monitor circuit 21 has the same construction as the voltage drop detection circuit 21A shown in FIG. 5. The output of the voltage drop detection circuit 21A is inverted by the inverter and is supplied as ipb to the variable impedance circuit 20B. The switch SW2 of the variable impedance circuit 20B is constituted by a p channel MOS transistor, for example, and is controlled by the control signal ipb. When the internal voltage VIM of the power source wire 10 drops under the standby state and the switch SW2 is turned ON, the level of the power source potential side power source node arvdd rises in response to the drop of the internal voltage VIM. Therefore, the potential difference between the ground potential side power source node arvss and the power source potential side power source node arvdd is prevented from drastically dropping and breakage of the data of the static memory cell 18 is prevented.

Figure 16:
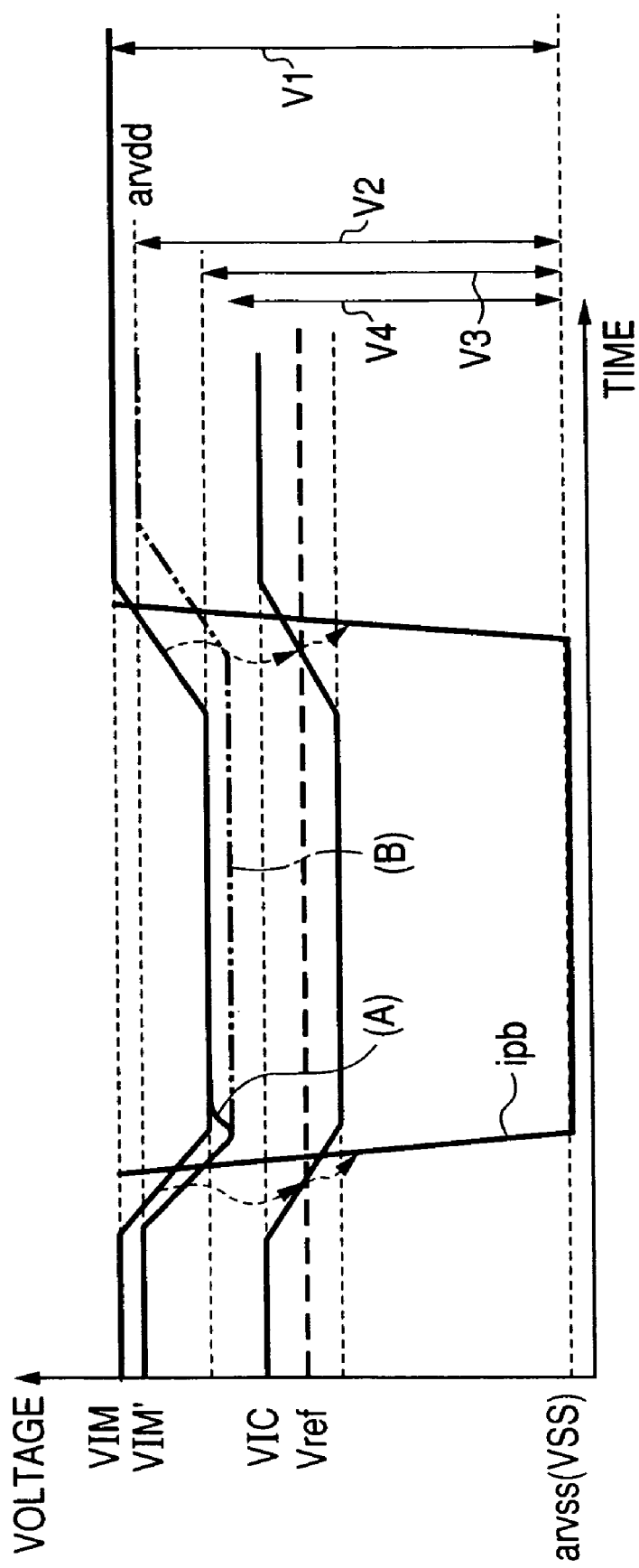
FIG. 16 is a timing chart typically showing an operation of the SRAM shown in FIG. 15 under the standby state.

FIG. 16 shows an example of the operation waveform. It will be assumed, for example, that the internal power source voltage VIM undesirably drops to VIM' when the level of the power source node arvdd on the VIM side is set to a lower level than the internal power source potential VIM under the standby state. If this state is left as such, the level of the power source node arvdd similarly drops (waveform B). When VM21 described above detects the drop at this time, the switch SW2 is turned ON, the power source node arvdd is set to a potential substantially equal to the internal power source voltage VIM (waveform A). When the internal power source potential VIM thereafter rises and the returns to the original level, the switch SW2 is closed and the power source node arvdd gets steady at the voltage drop level corresponding to the voltage division voltage by the variable impedance circuit 20B with respect to the power source voltage VIM and is returned to the normal standby state. In FIG. 16, the potential difference between the pair of the power source nodes arvss and arvdd of the static memory cell 18 is V1 under the active state, is V2 under the standby state, is V3 when impedance control is made by 20B when the internal power source potential VIM undesirably drops under the standby state and is V4 when such an impedance control is not made.

The SRAM3 mounted as on-chip to the microcomputer 1 described above can acquire the following effects. Even when the internal power source voltage VIM on the high potential side drops or the ground potential VSS on the low potential side rises when the SRAM3 is under the standby state, the SRAM3 can suppress the drop of the data holding potential of the static memory cell 18 in response to such a change. Accordingly, the data is not easily broken and reliability of information storage of the SRAM3 can be improved. Because the retention data of the SRAM3 is not easily broken, the erroneous operation of the microcomputer 1 can be suppressed on the assumption that the SRAM3 is utilized for the work areas of the CPU2 or as the cache memory, and reliability of the overall system can be improved.

Lowering of the operation voltage and a higher operation speed of semiconductor integrated circuits (semiconductor devices) having a memory such as a microcomputer mounted thereto will proceed in future and noise in the power source wires and the proportion of voltage fluctuation will become greater. Consequently, data breakdown factors of the memory cells will increase. On the other hand, the sub-threshold leakage current of the MOS transistor increases with the increase of the scale of the system and with miniaturization of semiconductor devices and power consumption under the standby state is likely to increase. The SRAM3 described above can simultaneously solve these two different problems.

Though the invention has been explained concretely with reference to the embodiments thereof, the invention is not limited to the embodiments but can of course be changed or modified in various ways without departing from its scope.

For example, the static memory cell is not limited to the CMOS type or to the high resistance load type. The application of the static memory cell is not limited to the memories such as the SRAM but includes registers. Concrete circuit constructions of the monitor circuit and the voltage control circuit are not limited to the constructions described above but may be changed appropriately.

Though the foregoing explanation deals with the case where the voltage lowered by the regulator is the internal power source, the invention can of course be applied to a semiconductor integrated circuit using an external power source as the operation power source of an internal circuit. The invention is not limited to the memory such as the on-chip SRAM mounted to a data processing LSI such as a microcomputer but can be applied to a memory discrete LSI, too. The application of the memory is not limited to the work area of the CPU, either, but can be broadly applied to other memory applications.

What is claimed is:

1. A semiconductor integrated circuit comprising:
   a pair of power source wires;
   a plurality of static memory cells;
   a voltage control circuit for controlling an operation voltage applied from said power source wires to said static memory cells;
   a monitor circuit for monitoring a voltage of said power source wires; and
   a mode control circuit for controlling a plurality of operation modes,
   wherein:
   said mode control circuit controls a low power consumption mode of said semiconductor integrated circuit;
   said monitor circuit detects a change of decrease of a potential difference between said pair of power source wires; and
   said voltage control circuit executes control in such a manner as to increase a lower potential among potentials of a pair of power source nodes of said static memory cell in response to indication of the low power consumption mode by said mode control circuit and executes control in such a manner as to decrease the lower potential among potentials of said pair of power source nodes of said static memory cell in response to detection of the rise of the potential of said lower power source wires by said monitor circuit.

2. A semiconductor integrated circuit as defined in claim 1, wherein
   a substrate area of an MOS transistor constituting said static memory cell is connected to a corresponding power source wire,
   a threshold voltage of said MOS transistor is increased in response to the rise of the lower potential among the potentials of said pair of power source nodes of said static memory cell, and
   the threshold voltage of said MOS transistor is decreased when the lower potential among the potentials of said pair of power source nodes of said static memory cell is increased.

3. A semiconductor integrated circuit as defined in claim 2, wherein said voltage control circuit is a variable impedance circuit arranged in a path for applying a ground potential to said static memory cell, and said variable impedance circuit is brought into a high impedance state as viewed from said static memory cell and controls an n channel MOS transistor in an increasing direction of a threshold voltage thereof and is brought into a low impedance state as viewed from said static memory cell and controls said n channel MOS transistor in a decreasing direction of a threshold voltage thereof.

4. A semiconductor integrated circuit as defined in claim 1, wherein said monitor circuit detects a change of a decrease of the potential difference between said pair of power source wires on the basis of a level change of one of the power source wires for supplying the ground potential.

5. A semiconductor integrated circuit as defined in claim 1, which includes a static RAM and a central processing unit and wherein said static RAM includes said static memory cell, said voltage control circuit and said monitor circuit.

6. A semiconductor integrated circuit as defined in claim 5, wherein said mode control circuit indicates the low power consumption mode to said static RAM and keeps a module standby mode while keeping an active state of said central processing unit.

7. A semiconductor integrated circuit as defined in claim 5, wherein said static RAM is a cache memory connected to said central processing unit and said mode control circuit indicates the low power consumption mode to said cache memory when said mode control circuit indicates the low power consumption mode to said central processing unit.

* * * * *